United States Patent
Saito

[11] Patent Number: 6,136,676
[45] Date of Patent: Oct. 24, 2000

[54] SEMICONDUCTOR DEVICE MANUFACTURING METHOD

[75] Inventor: Kazumi Saito, Tokyo, Japan

[73] Assignee: NEC Corporation, Tokyok, Japan

[21] Appl. No.: 09/218,017

[22] Filed: Dec. 22, 1998

[30] Foreign Application Priority Data

Dec. 24, 1997 [JP] Japan ................................ 9-354617

[51] Int. Cl.⁷ ............................................. H01L 21/3205
[52] U.S. Cl. ........................................ 438/587; 438/587
[58] Field of Search ................................ 438/636, 706, 438/711, 700, 625, 587; 430/316; 216/41

[56] References Cited

U.S. PATENT DOCUMENTS

| | | | |
|---|---|---|---|
| 5,773,199 | 6/1999 | Linliu et al. | 430/316 |
| 5,863,834 | 1/1999 | Kawaguchi et al. | 438/625 |
| 5,998,300 | 12/1999 | Tabra | 438/700 |

FOREIGN PATENT DOCUMENTS

| | | |
|---|---|---|
| 0 573 212 | 12/1993 | European Pat. Off. . |
| 0 820 093 | 1/1998 | European Pat. Off. . |
| 8-153704 | 6/1996 | Japan . |
| 2 285 336 | 7/1995 | United Kingdom . |

*Primary Examiner*—David Nelms
*Assistant Examiner*—David Nhu
*Attorney, Agent, or Firm*—Young & Thompson

[57] ABSTRACT

In a semiconductor device manufacturing method, a gate insulating film is formed on a silicon substrate, a conductive film made of a conductive material is formed on a insulating film, an anti-reflecting coating made of an organic material is formed on the conductive film, a photosensitive resist film is formed on the anti-reflecting coating, a predetermined optical image on the resist film is developed by exposure to form a resist pattern, the anti-reflecting coating is then selectively removed by dry etching using a plasma of a gas mixture containing oxygen gas, a reactive gas, and an inert gas, while using the resist pattern as a mask, thereby forming a pattern, and the conductive film is etched by using the resist pattern as a mask, thereby forming an electrode.

20 Claims, 2 Drawing Sheets

SEMICONDUCTOR DEVICE MANUFACTURING METHOD

BACKGROUND OF THE INVENTION

The present invention relates to a semiconductor device manufacturing method used for forming an interconnection pattern in a multilevel interconnection structure.

An LSI (Large Scale Integrated circuit) is manufactured by repeating the steps of forming thin films made of various types of materials on a semiconductor substrate and partially removing the thin films by lithography and etching. The role of lithography is to form a pattern having a predetermined size at a predetermined position. The role of etching is to partially remove the thin films from the surface by using the pattern, formed by lithography, as a mask, thereby forming an interconnection made of a thin-film material to have a desired size.

An explanation will be made by way of formation of a gate electrode interconnection of a MOS (Metal Oxide Semiconductor) transistor constituting an LSI.

As shown in FIG. 2A, a gate insulating film 202 is formed on a silicon substrate 201, and a conductive film 203, e.g., polysilicon, is formed on the gate insulating film 202. As shown in FIG. 2B, an anti-reflecting coating (ARC) 204 is formed on the conductive film 203.

As shown in FIG. 2C, a resist pattern 205 is formed on the anti-reflecting coating 204 by known photolithography. In this photolithography, since the anti-reflecting coating 204 is formed under the resist pattern 205, the standing-wave effect which hinders high-precision pattern formation can be prevented.

As shown in FIG. 2D, the anti-reflecting coating 204 is etched by using the resist pattern 205 as a mask, thereby forming a pattern 204a. This etching is performed by dry etching using a gas mixture obtained by adding chlorine ($Cl_2$) gas or hydrogen bromide (HBr) gas to oxygen gas.

Since the anti-reflecting coating 204 is an organic film, it can be etched by dry etching using oxygen gas. If only oxygen gas is used, side etching occurs to degrade the size precision. Generally, in the reaction process of dry etching, the reaction product can be dissociated in the plasma, can attach to the surface of the processing material again, can be deposited on the surface of the processing material in the plasma, or can cause polymerization reaction on the surface of the processing material. When the organic film is subjected to dry etching by the oxygen gas plasma, the obtained reaction product is mainly $CO_2$ and $H_2O$, which do not cause reattaching and deposition easily.

In contrast to this, for example, if oxygen gas and chlorine gas added to it are used to perform dry etching, deposition caused by plasma polymerization or the like occurs on the surface of the processing material. When deposition occurs on the side surface of the resist pattern 205 or the side surface of the pattern 204a of the anti-reflecting coating 204 that has begun to be exposed by etching, side etching can be suppressed. More specifically, in dry etching of the anti-reflecting coating 204 as the organic film, when an etching gas obtained by adding, e.g., chlorine gas, to the oxygen gas is used, the size precision can be increased.

As shown in FIG. 2E, by using the resist pattern 205 and pattern 204a as the mask, the conductive film 203 is etched to form gate electrodes 203a.

With the conventional method, in the step in FIG. 2D of forming the pattern 204a, since the conductive film 203 is partially overetched at the interface between the pattern 204a and conductive film 203, comparatively large subtrenches 301 are formed, as shown in FIG. 3A. While these subtrenches 301 are present, when the conductive film 203 is etched to form the gate electrodes 203a, the conductive film 203 is etched to disappear faster at the subtrench regions than at other regions because the conductive film 203 at portions corresponding to the subtrenches 301 has a smaller thickness than at other regions.

Thus, when the conductive film 203 at portions other than the gate electrodes 203a is to be completely removed, portions under the subtrenches 301 are also largely overetched. Accordingly, the gate insulating film 202 and part of the silicon substrate 201 are etched to form substrate damages 302, as shown in FIG. 3B.

These defects can be suppressed by decreasing the content of chlorine gas in etching of the anti-reflecting coating 204. More specifically, when the amount of reactive gas, e.g., chlorine gas, decreases, the size of the subtrenches 301 decreases.

When, however, the content of chlorine gas decreases, side etching is started to occur in turn, to cause a decrease in size precision. This causes a defect to lead to a decrease in yield.

SUMMARY OF THE INVENTION

It is an object of the present invention to provide a semiconductor device manufacturing method in which occurrence of a defect is suppressed to increase the semiconductor device manufacturing yield.

In order to achieve the above object, according to the present invention, there is provided a semiconductor device manufacturing method comprising the steps of forming an insulating film on a semiconductor substrate, forming a conductive thin film made of a conductive material on the insulating film, forming an anti-reflecting coating made of an organic material on the conductive thin film, forming a photosensitive resist film on the anti-reflecting coating, developing a predetermined optical image on the resist film by exposure to form a resist pattern, selectively removing the anti-reflecting coating by dry etching using a plasma of a gas mixture containing oxygen gas, a reactive gas, and an inert gas, while using the resist pattern as a mask, thereby forming an anti-reflecting coating pattern, and etching the conductive thin film by using the resist pattern as a mask, thereby forming an electrode.

DESCRIPTION OF THE PREFERRED EMBODIMENT

The present invention will be described in detail with reference to the accompanying drawings.

FIGS. 1A to 1E explain a semiconductor device manufacturing method according to an embodiment of the present invention. The explanation will be made by way of formation of a gate electrode interconnection of a MOS transistor constituting an LSI, in the same manner as FIGS. 2A to 2E.

Figure 1A:
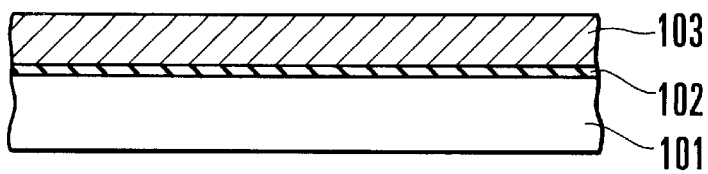
FIGS. 1A to 1E are sectional views showing the steps in a semiconductor device manufacturing method according to an embodiment of the present invention.
Figure 1B:
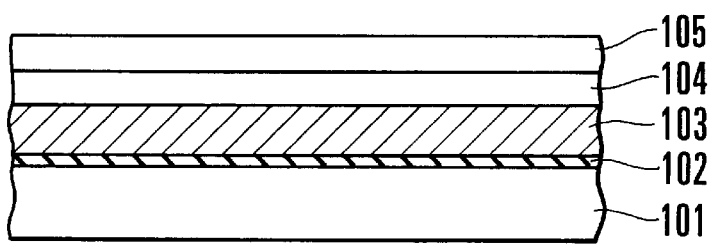

First, as shown in FIG. 1A, a gate insulating film 102 is formed on a silicon substrate 101, and thereafter a conductive film 103 such as polysilicon is formed on the gate insulating film 102. As shown in FIG. 1B, an anti-reflecting coating 104 is formed on the conductive film 103 to a thickness of about 200 nm, and a photoresist film 105 having positive photosensitivity is formed on the anti-reflecting coating 104 to a thickness of about 700 nm.

For example, if an ultraviolet ray having a wavelength of 248 nm is used as the exposure light source, SWK-EX1-D55 (trade name; manufactured by TOKYO OHKA KOGYO CO., LTD.) may be used as the anti-reflecting coating 104. For example, a solution of SWK-EX1-D55 is applied by spin coating to the silicon substrate 101 formed with the conductive film 103, and the resultant structure is heated to about 170° C. to 220° C., thereby forming the anti-reflecting coating 104.

A photoresist material is applied by spin coating to the silicon substrate 101 formed with the anti-reflecting coating 104, and a solvent or the like is removed from the coating film by evaporation by heating to a temperature of about 90° C. to 100° C., thereby forming the photoresist film 105.

Figure 1C:
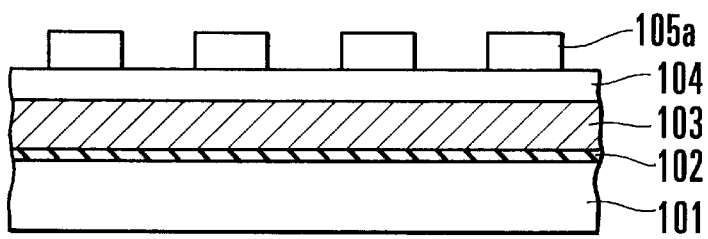

Subsequently, a desired optical image is projected and exposed on the photoresist film 105 by using a reduction projection exposure unit, thus forming a latent image. Thereafter, the latent image is developed with an alkali developing solution to remove a region where the optical image is projected, thereby forming a resist pattern 105a, as shown in FIG. 1C. This resist pattern 105a is preferably heated to about 110° C. to 120° C. in order to improve the dry-etching resistance.

In this exposure, exposure light reflected by the underlying layer also irradiates the photoresist film 105 on which the pattern is to be transferred, and accordingly incident light and reflected light interfere with each other to cause the standing-wave effect. The standing-wave effect largely, adversely affects the size precision of the resist pattern which is formed by photolithography. Hence, the anti-reflecting coating 104 described above is formed on the underlying layer to suppress reflection of the exposure light, thereby preventing the standing-wave effect.

Figure 1D:
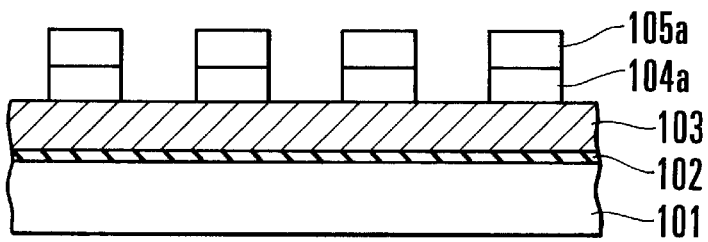

As shown in FIG. 1D, the anti-reflecting coating 104 is etched by using the resist pattern 105a as the mask, thereby forming a pattern 104a. This is performed by dry etching which uses a gas mixture obtained by adding argon gas as an inert gas to a gas mixture obtained by mixing chlorine gas or hydrogen bromide gas as a reactive gas to oxygen gas. More specifically, the anti-reflecting coating 104 is etched by setting the ratio of chlorine gas:oxygen gas:argon gas= 3:2:8, the pressure to 3 mTorr, and the plasma power to 350 W, and by controlling the substrate temperature to 35° C.

As described above, in dry etching for the purpose of pattern formation for the anti-reflecting coating 104 as an organic film, an etching gas added with not only oxygen but also chlorine gas is used in order to improve the size precision. Since chlorine gas is added, however, the problem of subtrench arises.

The anti-reflecting coating 104 can be etched while suppressing side etching with a combination of oxygen gas and hydrogen bromide gas and a combination of oxygen gas and tetrafluorocarbon ($CF_4$), other than the combination of oxygen gas and chlorine gas. When, however, dry etching is performed in this manner by adding a reactive gas to oxygen gas, the problem of subtrench still occurs.

For this reason, in this embodiment, an inert gas such as argon is used, as described above, in addition to oxygen gas and a reactive gas, to perform dry etching of the anti-reflecting coating 104. As a result, in this embodiment, the size of subtrenches can be suppressed as much as possible.

In the embodiment described above, the ratio of chlorine gas:oxygen gas:argon gas=3:2:8. However, the present invention is not limited to this. For example, if the amount of inert gas such as argon to the total amount of the etching gas which is introduced for etching is set to fall within a range of 20% to 90%, the size of subtrenches to be formed can be suppressed as much as possible.

The subtrenches that are formed only few are supposed to be formed from the early stage of etching of the anti-reflecting coating 104 using the resist pattern 105a as the mask. More specifically, in etching the anti-reflecting coating 104, the pattern boundary portion of the resist pattern 105a is etched faster than other portions, and subtrenches are formed in the anti-reflecting coating 104 in the early stage of this etching.

Accordingly, argon gas must be added at the beginning of dry etching of the anti-reflecting coating 104. When argon gas is added in this manner, since argon gas is a positive gas, charge-up in the resist pattern 105a as the organic substance is suppressed, and concentration of reactive ions on the boundary portion of the photoresist film 105 can be suppressed.

Figure 1E:
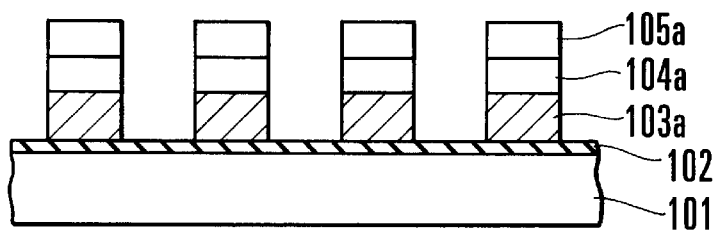
Figure 2A:
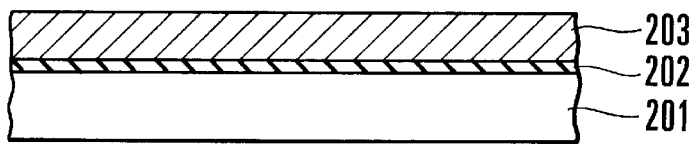
FIGS. 2A to 2E are sectional views showing the steps in a conventional semiconductor device manufacturing method.
Figure 2B:
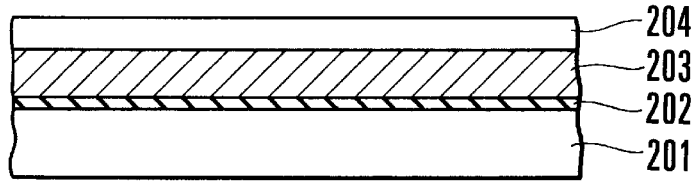
Figure 2C:
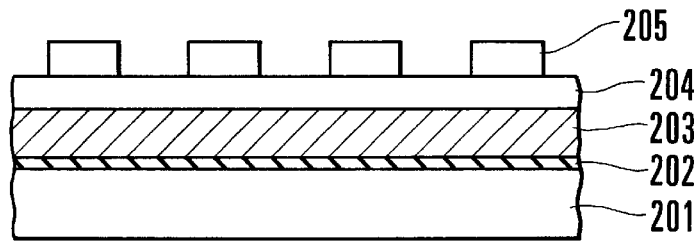
Figure 2D:
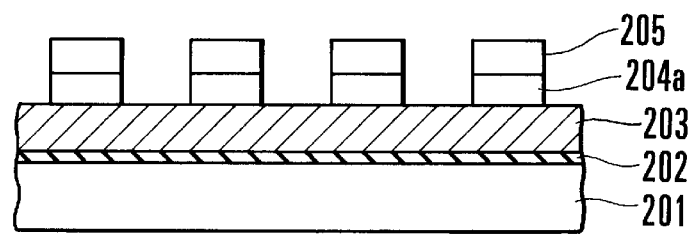
Figure 2E:
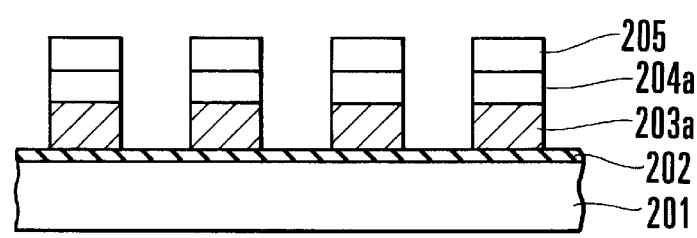
Figure 3A:
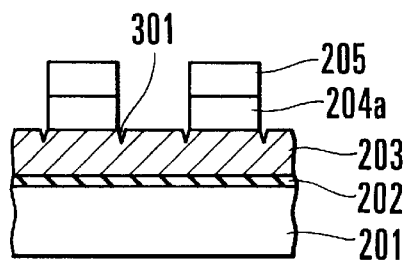
FIGS. 3A and 3B are sectional views for explaining how subtrenches are formed.
Figure 3B:
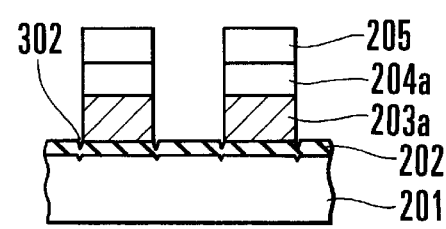

After the pattern 104a is formed, the conductive film 103 is etched by using the photoresist film 105 and pattern 104a as the mask, thereby forming gate electrodes 103a, as shown in FIG. 1E.

As a result, according to this embodiment, defects such as formation of an overetched portion at the boundary between the gate insulating film 102 and gate electrodes 103a can be suppressed, and the gate electrodes 103a can be formed without causing an abnormality in the gate insulating film 102.

As has been described above, according to the present invention, dry etching is performed by using a plasma of a gas mixture of oxygen gas, a reactive gas, and an inert gas while using a resist pattern as the mask. While a plasma reaction product generated by reaction with the reactive gas is deposited as the side wall protective film on the side wall of the resist pattern and a pattern formed under the resist pattern, the anti-reflecting coating is selectively removed, thereby forming the pattern. Therefore, etching with different etching rates, that partly occurs in etching the anti-reflecting coating, is suppressed.

As a result, a defect caused by partial abnormal etching of the anti-reflecting coating can be suppressed, so that the semiconductor device manufacturing yield is improved.

What is claimed is:

1. A semiconductor device manufacturing method of precisely forming electrodes comprising the steps of:

forming an insulating film on a semiconductor substrate;

forming a conductive thin film made of a conductive material on said insulating film;

forming an anti-reflecting coating made of an organic material on said conductive thin film;

forming a photosensitive resist film on said anti-reflecting coating;

developing a predetermined optical image on said resist film by exposure to form a resist pattern;

selectively removing said anti-reflecting coating by dry etching using a plasma of a gas mixture containing oxygen gas, a chlorine reactive gas, and an inert gas, while using said resist pattern as a mask, thereby forming an anti-reflecting coating pattern; and etching said conductive thin film by using said resist pattern as a mask, thereby forming an electrode.

2. A method according to claim 1, wherein the step of forming said anti-reflecting coating pattern comprises depositing a plasma product, generated by reaction with said reactive gas, as a side wall protective film on side walls of said resist pattern and said anti-reflecting coating pattern.

3. A method according to claim 1, wherein the inert gas is argon gas.

4. A method according to claim 1, wherein the inert gas is mixed by an amount falling within a range of 20% to 90% a total amount of the gas mixture.

5. A method according to claim 4, wherein the reactive chlorine gas, the oxygen gas, and the inert gas satisfy a flow rate ratio of 3:2:8.

6. A method of controlling the formation of subtrenches in an anti-reflecting coating and transference of such subtrenches via a gate electrode layer and a gate insulating film to control substrate damage, comprising the steps of:

forming a gate insulating film directly on a semiconductor substrate;

forming a conductive gate electrode layer contacting said gate insulating film;

forming an anti-reflecting coating made of an organic material on the gate electrode layer;

forming a photosensitive resist film on the anti-reflecting coating;

developing an optical image on the resist film to form a resist pattern;

selectively dry etching the anti-reflective coating while controlling formation of subtrenches at a pattern boundary portion of the resist pattern, by controllably adding an inert gas, at a beginning of dry etching, to a gas mixture comprising oxygen gas and a reactive gas; and etching the gate electrode layer by using the resist pattern as the mask, wherein the controlled addition of the inert gas suppresses formation of subtrenches in the anti-reflective coating to maintain the gate electrode layer substantial free of subtrenches and block transference of subtrenches from the anti-reflective coating to suppress substrate damage.

7. The method of claim 6, wherein in said step of selectively dry etching the anti-reflective coating while controlling formation of subtrenches, the addition of the inert gas is controlled to suppress a charge-up in the resist pattern.

8. The method of claim 6, wherein in said step of selectively dry etching the anti-reflective coating while controlling formation of subtrenches, the addition of the inert gas is controlled to suppress a concentration of reactive ions on the pattern boundary portion of the resist pattern.

9. The method of claim 6, wherein in said step of selectively dry etching the anti-reflective coating further deposits a plasma reaction product generated by reaction with the reactive gas to form a protective layer on the resist pattern and etched sidewalls of the anti-reflective coating.

10. The method of claim 6, wherein said step of selectively dry etching uses chlorine gas as the reactive gas.

11. The method of claim 6, wherein said step of selectively dry etching uses hydrogen bromide gas as the reactive gas.

12. The method of claim 6, wherein said step of selectively dry etching uses tetrafluorocarbon gas as the reactive gas.

13. The method of claim 6, wherein said step of selectively dry etching uses argon gas as the inert gas.

14. The method of claim 6, wherein:

chlorine gas is used as the reactive gas, argon gas is used as the inert gas, and a chlorine gas, oxygen gas, and argon gas flow rate ratio of 3:2:8 is used.

15. A method of controlling the formation of subtrenches in an anti-reflecting coating during the manufacture of a semiconductor device, comprising the steps of:

forming an anti-reflecting coating made of an organic material over a semiconductor substrate;

forming a resist pattern contacting the anti-reflecting coating; and controlling formation of subtrenches at a pattern boundary portion of the resist pattern, during dry etching the anti-reflective coating, by controllably adding an inert gas, at a beginning of dry etching, to a gas mixture comprising oxygen gas and a reactive gas, wherein the controlled addition of the inert gas suppresses formation of subtrenches in the anti-reflective coating.

16. The method of claim 15, wherein in said step of selectively dry etching the anti-reflective coating while controlling formation of subtrenches, the addition of the inert gas is controlled to suppress a charge-up in the resist pattern.

17. The method of claim 15, wherein in said step of selectively dry etching the anti-reflective coating while controlling formation of subtrenches, the addition of the inert gas is controlled to suppress a concentration of reactive ions on the pattern boundary portion of the resist pattern.

18. The method of claim 15, wherein said controlling step uses chlorine gas as the reactive gas.

19. The method of claim 18, wherein said controlling step uses argon gas as the inert gas.

20. The method of claim 18, wherein:

chlorine gas is used as the reactive gas, argon gas is used as the inert gas, and a chlorine gas, oxygen gas, and argon gas flow rate ratio of 3:2:8 is used.

* * * * *